US007981462B2

(12) United States Patent
Büstgens

(10) Patent No.: US 7,981,462 B2
(45) Date of Patent: Jul. 19, 2011

(54) METHOD FOR APPLYING PAINTS AND VARNISHES

(75) Inventor: Burkhard Büstgens, Freiburg (DE)

(73) Assignee: Burkhard Büstgens, Gundelfingen (DE)

( * ) Notice: Subject to any disclaimer, the term of this patent is extended or adjusted under 35 U.S.C. 154(b) by 1264 days.

(21) Appl. No.: 10/502,463

(22) PCT Filed: Jan. 22, 2003

(86) PCT No.: PCT/DE03/00162

§ 371 (c)(1),
(2), (4) Date: Jul. 26, 2004

(87) PCT Pub. No.: WO03/066239

PCT Pub. Date: Aug. 14, 2003

(65) Prior Publication Data

US 2005/0100680 A1 May 12, 2005

(30) Foreign Application Priority Data

Jan. 24, 2002 (DE) ................................. 102 02 553

(51) Int. Cl.
*G05B 19/18* (2006.01)
*C23C 16/52* (2006.01)
*B05D 5/00* (2006.01)
*B05D 1/02* (2006.01)
*B05C 11/00* (2006.01)
*B05B 3/00* (2006.01)

(52) U.S. Cl. ......... 427/8; 427/256; 427/427.2; 118/668; 118/669; 118/675; 118/676; 118/679; 118/680; 118/323; 700/253

(58) Field of Classification Search ............... 427/427.2, 427/136, 8, 256; 347/19; 118/668, 669, 118/675, 676, 679, 680, 323
See application file for complete search history.

(56) References Cited

U.S. PATENT DOCUMENTS 3,553,371 A * 1/1971 Suenaga ...................... 358/502

(Continued)

FOREIGN PATENT DOCUMENTS

DE 195 25 528 A1 1/1997

(Continued)

OTHER PUBLICATIONS

German Search Report, citing the four document cited above.

(Continued)

*Primary Examiner* — Timothy H Meeks
*Assistant Examiner* — Mandy C Louie

(57) ABSTRACT

The invention relates to a method for applying paints or varnishes with the aid of an application device in order to apply a color design on surfaces of buildings or public or civil engineering works in accordance with a previously executed implementation of a digital image model in a previously recorded digital surface object that represents the surface of the object. According to the invention, the application device moves on the surface of the object while contacting the surface thereof, the position of the application device is continuously measured or calculated using motion sensors and paint is applied in accordance with said implementation depending on the position thus determined. Application of paint by the application device is automatically stopped if the position of the application device with respect to a predefined position error acceptance threshold cannot be determined in a sufficiently accurate manner or if the corresponding paint or varnish has been fully applied in the position of the paint applying elements.

1 Claim, 12 Drawing Sheets

U.S. PATENT DOCUMENTS

Figure 1:
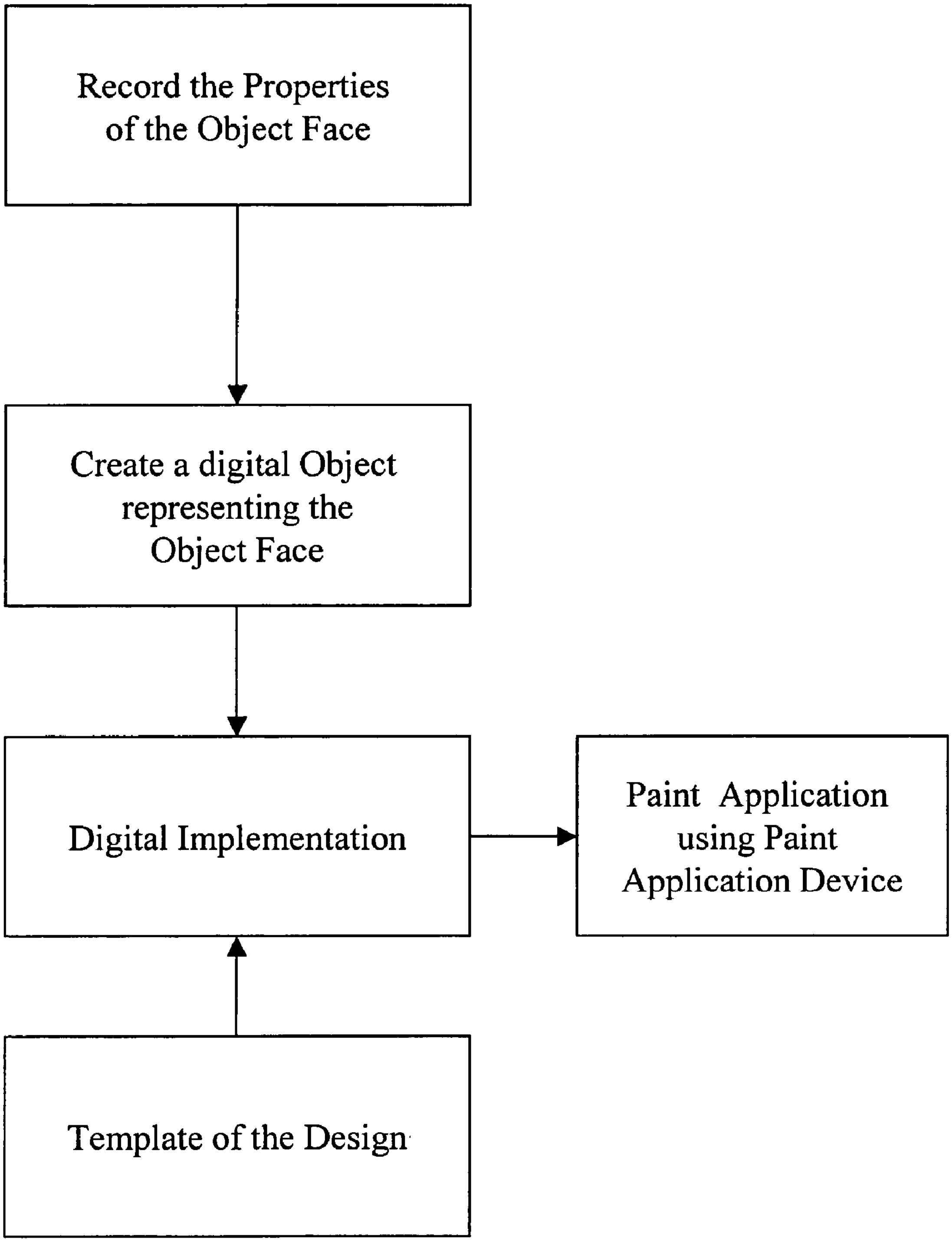

| | | | | |
|---|---|---|---|---|
| 4,920,422 | A | 4/1990 | Lapierre | |
| 5,525,027 | A * | 6/1996 | Jinno et al. | 414/680 |
| 5,685,651 | A | 11/1997 | Hayman et al. | |
| 5,927,872 | A * | 7/1999 | Yamada | 400/88 |
| 6,045,871 | A * | 4/2000 | Matt et al. | 427/388.4 |
| 6,074,693 | A * | 6/2000 | Manning | 427/137 |
| 6,312,124 | B1 * | 11/2001 | Desormeaux | 347/109 |
| 6,467,978 | B1 * | 10/2002 | Tideman, Jr. | 400/76 |
| 6,517,266 | B2 * | 2/2003 | Saund | 400/88 |
| 6,942,402 | B1 * | 9/2005 | Slupe et al. | 400/88 |
| 7,029,199 | B2 * | 4/2006 | Mayfield et al. | 404/84.05 |
| 2002/0158955 | A1 * | 10/2002 | Hess et al. | 347/108 |
| 2002/0171731 | A1 * | 11/2002 | Saund | 347/109 |
| 2003/0037448 | A1 * | 2/2003 | Saksa | 33/35 |
| 2004/0027414 | A1 * | 2/2004 | Boleda et al. | 347/37 |

FOREIGN PATENT DOCUMENTS

| | | | |
|---|---|---|---|
| FR | 2 601 265 | A1 | 1/1988 |
| WO | WO 00/48841 | A1 | 8/2000 |

OTHER PUBLICATIONS

International Search Report, May 30, 2003, from International Phase of the instant application.

* cited by examiner

METHOD FOR APPLYING PAINTS AND VARNISHES

The invention relates to a method and device for the application of paints or varnishes in order to color the object faces of objects like buildings and public and civil engineering works according to an image template. These can be object faces for example of inside or outside walls, floors and ceilings of residential or industrial buildings, but also object faces out of concrete like bridges, tunnels and road construction works or walls for noise protection, blinds or fixations or to surfaces of related species.

Today the afore mentioned object faces are without exception painted manually by paintbrush or paint roller or are color-sprayed using an air gun. The paint serves for sealing purposes of the wall on the one hand, but it is also utilized for decoration purposes. If image themes are to be applied onto the mentioned surfaces by paint the paint application can only be performed by talented craftspeople or artists, a process that is normally tedious and thus expensive. Often there can be an essential discrepancy between the expectations of the client and the finalized image. A pure technical method would be desirable, which makes it possible to apply an image theme according to a template onto the mentioned surfaces by using paints or varnishes without requiring artistic skills and which additionally ensures a high quality of image recording. So it is obvious, that a method and a device do not exist, which allow for example to apply a color design according to a digital template onto surfaces of architectural objects like buildings and public and civil engineering works.

Based on that fact it is the task of the invention to create a simple and fast, thereby a cost effective as well as reliable method to apply paints or varnishes onto foremost architectural object surfaces, with the purpose to apply an arbitrary color design.

The technical solution is characterized as in claim 1.

According to claim 1 the application device is brought into contact with the surface and is moved arbitrarily on the surface. The application device measures its position continuously by use of a non-contact positioning system or additional motion sensors and it applies paint depending on the position measured in accordance with said implementation. In doing so the application device stops the application of paint automatically, if its position with respect to a predetermined position error acceptance threshold cannot be determined sufficiently accurate or paint has already been fully applied in the position of the paint applying elements.

By this a fast and reliable method is created; by which it is possible, to apply existing digital image data onto arbitrary faces of objects like buildings and public and civil engineering works. The herewith claimed method allows the operator of the paint application device to work intuitively by moving the device in an arbitrary sequence over arbitrary positions of the object face. This intuitive way of operation especially enables to paint the surface completely, also around protrusions, balconies, doors, windows, sills or cornices.

The method according to the invention is based on the thought to transfer the color information of every image pixel, which was previously stored into a file, to the object surface, by measuring the position of the paint application device continuously and by applying paint after having compared the stored color information with the corresponding position of the paint application device. To apply a color design according to the method of the invention, it is a prerequisite that the object face has been recorded previously by using measurement techniques, resulting in a digital object, which is for example a CAD-representation of the surface, and that next to this a template of the desired design object has been implemented according to the designer's wishes, i.e., there is a geometric assignment of the color data to the real positions of the object face available, see FIG. 1. Color properties of the original object surface could have been implemented as well, if having been recorded additionally, thus making it possible to include existing color features into the design or to compensate unwanted color features like spots on the surface.

When the movable paint application device is moved over the object face, the position measurement system continuously supplies the actual position. Due to the known position of each single paint application element within the design of the device and the known position of the paint application device relative to the object face the position of every paint application element is computed in realtime. The control unit then fetches the color values from the surface object, which is stored in the system memory as assigned to the position-coordinates, and sends exactly timed commands for color application to the individual paint nozzles. Once a virtual color pixel has been fully applied onto the object face the pixel is, for example, assigned the attribute "done", switched passive or the color value is pasted by a value, which does not result in a color application. By this an unintended multiple color application at a single point can be avoided.

At least once every point of object face has to be passed over by the application head during paint application. Thanks to the integrated position calculation a continuous motion of the device is not required, because at any time the device compares the actual position with respect to the stored image to be recorded and commands for paint application are only launched, if paint has to be applied at that position, and has not already been finalized by an earlier stroke of the device.

Figure 2:
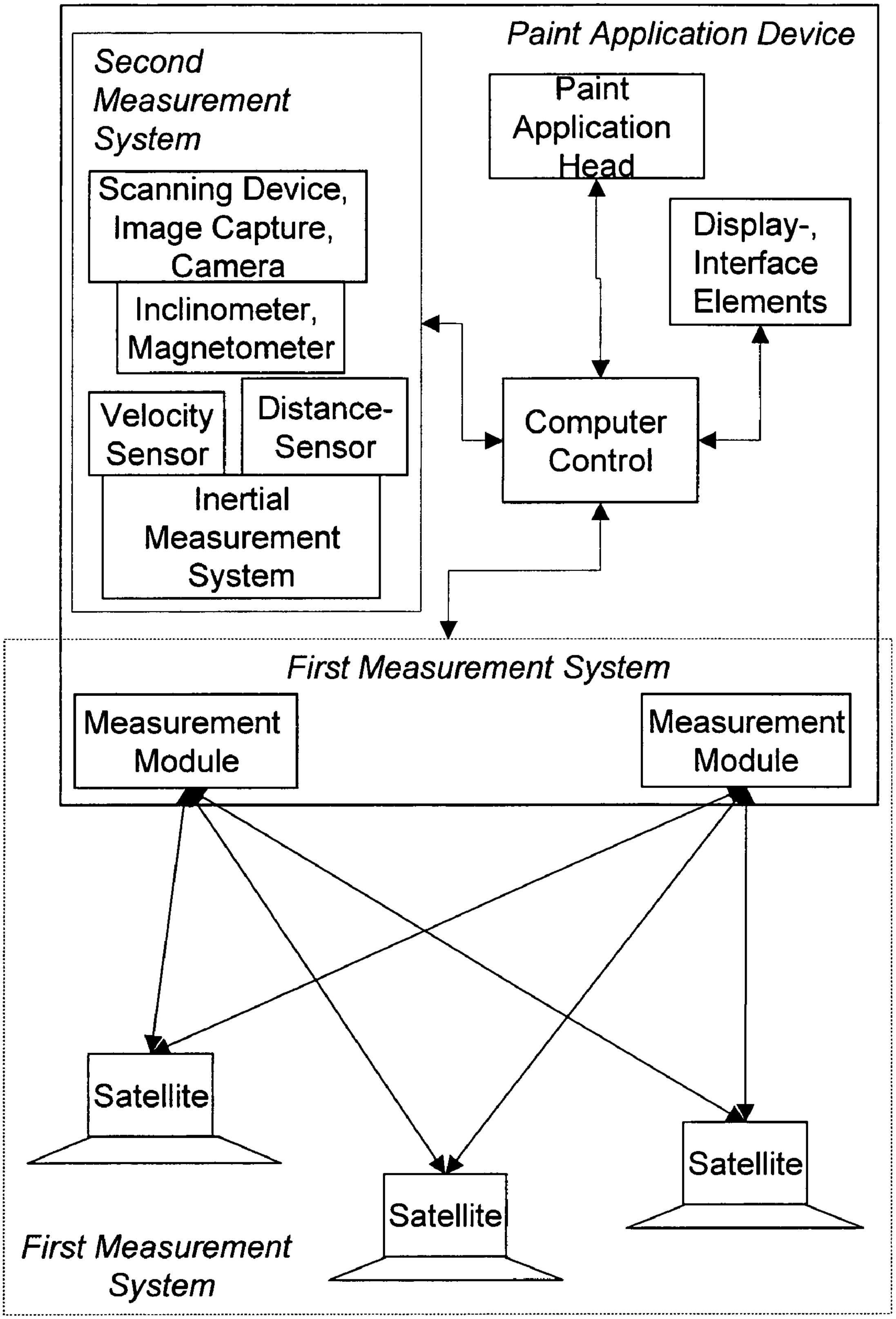

The position measurement of the paint application device can be done in multiple ways by use of position measurement systems, see also the system chart in FIG. 2. These may be divided into two categories:

The systems herein referred to as first measurement system measure the position of movable components in relation to fixed landmarks, herein called satellites, also as part as of the first measurement system. The movable parts of the first measurement system can be included into the paint application device. It is a characteristic of the first measurement system that there has to be an intervisibility between the satellites and the moving components. Intervisibility can be often disturbed, for example by scaffoldings, cornices or branches, and position sensing is interrupted.

The systems herein referred to as second measurement system measure the motion of the paint application device for example by sensors, which are included in the paint application device and which do not utilize fixed landmarks. These are for example linear and rotational acceleration sensors, rotational rate sensors, velocity sensors, magnetometers, inclinometers, and imaging sensors, which inspect a small area of the object face, from which the motion is calculated for example by correlation methods. The measurement methods of the second measurement system are further characterized in being fast, being not able to sense an absolute position and being sensitive to drift.

The accuracy requirements of the position sensing are high: When assuming an absolute image resolution of 0.5 mm in a range of 10 meters a realtive accuracy of 50 ppm is resulting. In parallel it is required, that the paint application device can be moved sufficiently fast at any point of the object face and thereby being always able to measure its position with the necessary rate.

Some measurement methods according to the first measurement system can only provide a low measurement rate.

So, position information is not permanently available, also and especially in case of disturbed intervisibility between satellites and the movable components. On the other hand the much faster methods as used in the second measurement system are suited to overtake navigation for short time periods. It is obvious, that combining both allows for covering the object face completely on the one hand and allows for a high feed rate on the other hand.

Assuming a paint application device operated manually by an operator the device control acts as follows, see FIG. 10:

The operator brings the paint application device into contact with the object surface by pressing it against the surface. When the color application is started by a command from the operator, it is checked first if position informations are available from the first measurement system. For this intervisiblity has to be possile between the relevant components of the first measurements system. If not, the operator has to be informed, either by a negative message or by not providing a positive message, and the operator is instructed to move the paint application device over the surface, until the first measurement system supplies a valid position. This position is used by the paint application control and to initialize the second measurement system. Initializing can simply mean to reset the initial conditions of the motion sensors. Now follows the computation of the position based on the available measurement data as provided from the first and the second measurement system. In this case, right after an initialization, the position calculated is identical to the position provided from the first measurement system. A positioning error is estimated and handed over to a range check routine to get a decesion, whether paint may be applied or not. If the position error exceeds an acceptance threshold, the color application is stopped and the afore described process of finding an initial position has to be repeated. Typically, the estimated position error does not exceed the acceptance threshold, so paint application can be performed and new position data can be read. The described cycle is running so fast, that the paint application device has already moved due to the velocity of the motion. So a position error is produced due to said motion and furthermore by the fact, that every paint application head induces a definite time delay when transporting the paint onto the surface. As a consequence the resulting position error has to be corrected for example by implementing position offsets. Practically this means, that those color values of the color—position assignment are forwarded to the color application head for paint application, which according to the color—position assignment are located ahead of the actual realtime position. The position offset generally is a function of the velocity and the acceleration. It is recommended to additionally evaluate and check the acceleration of the device before applying paint in order to automatically prevent paint application during jerkey motions. After having applied paint, the first measurement system is checked for a valid position. A position may by invalid, if intervisibility is disturbed, as already explained above, or if the measurement rate of the first measurement system is lower than the actual cycle speed of system. If there are new data available from the first measurement system, the calculation of the actual position may be based on actual position data as well as past position data. If not, a message will be sent to the operator and the subsequent position calculation will only be based on actual measurement data from the second measurement system and past position information. In both cases the position error is evaluated and checked before issuing the paint application command. It is obvious, that when moving the paint application device far into an area, where intervisibility fails, the position error increases from cycle to cycle and finally the paint application is stopped automatically.

Based on the messages the operator is able to recognize regions, where intervisibility issues within the first measurement system occur. If he has identified an aforesaid region, he is advised to bring the paint application device into contact with the object face at a point of known position and to move the device into the said region shortest or quickest path. In case of a very large region, when also repeated action does not result in a paint application, the operator is advised to mount additional landmarks of the first measurement system.

LIST OF FIGURES

FIG. 1: Preparatory work

FIG. 2: Complete system

Figure 3:
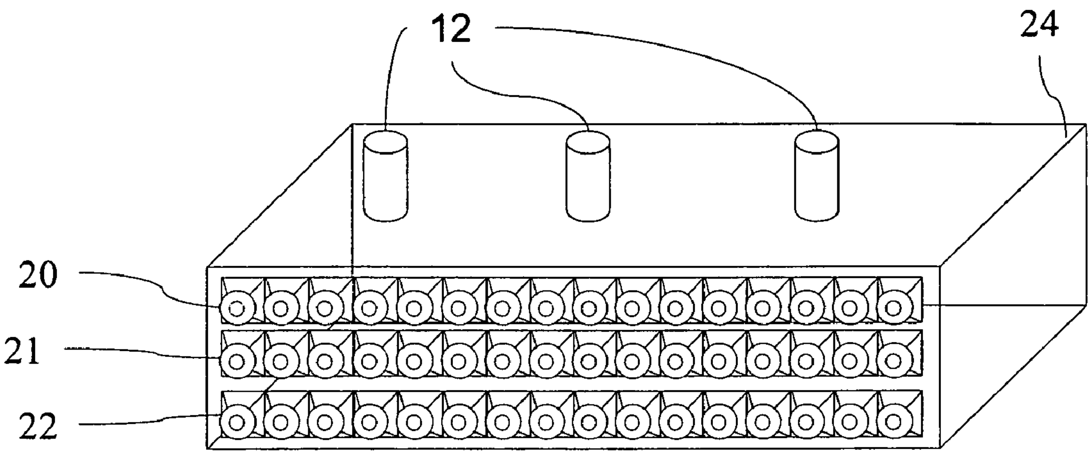

FIG. 3: Paint application head

Figure 4:
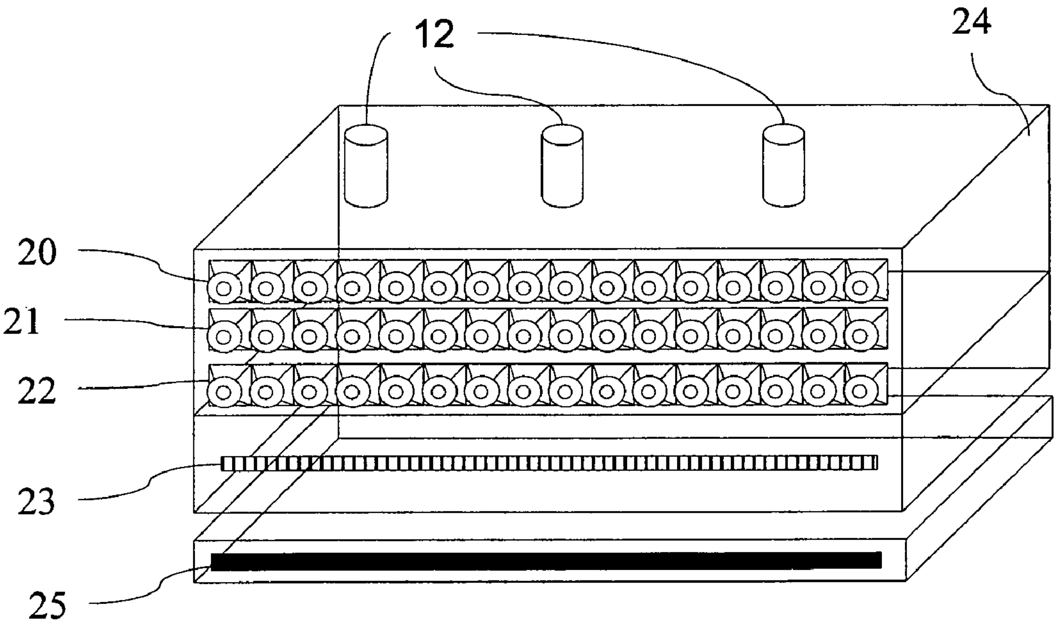

FIG. 4: Extended paint application head

Figure 5:
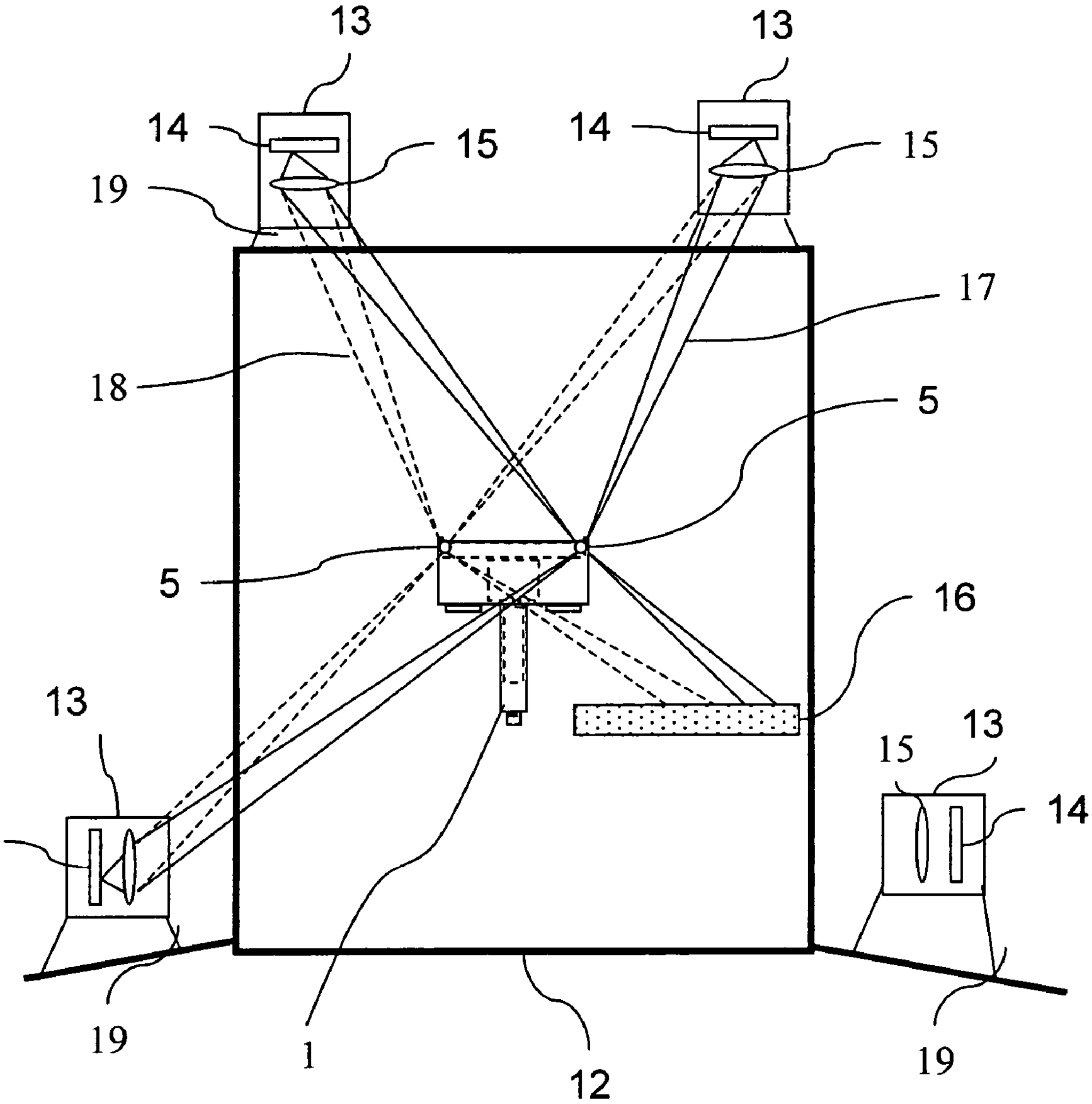

FIG. 5: First embodiment of the first measurement system

Figure 6:
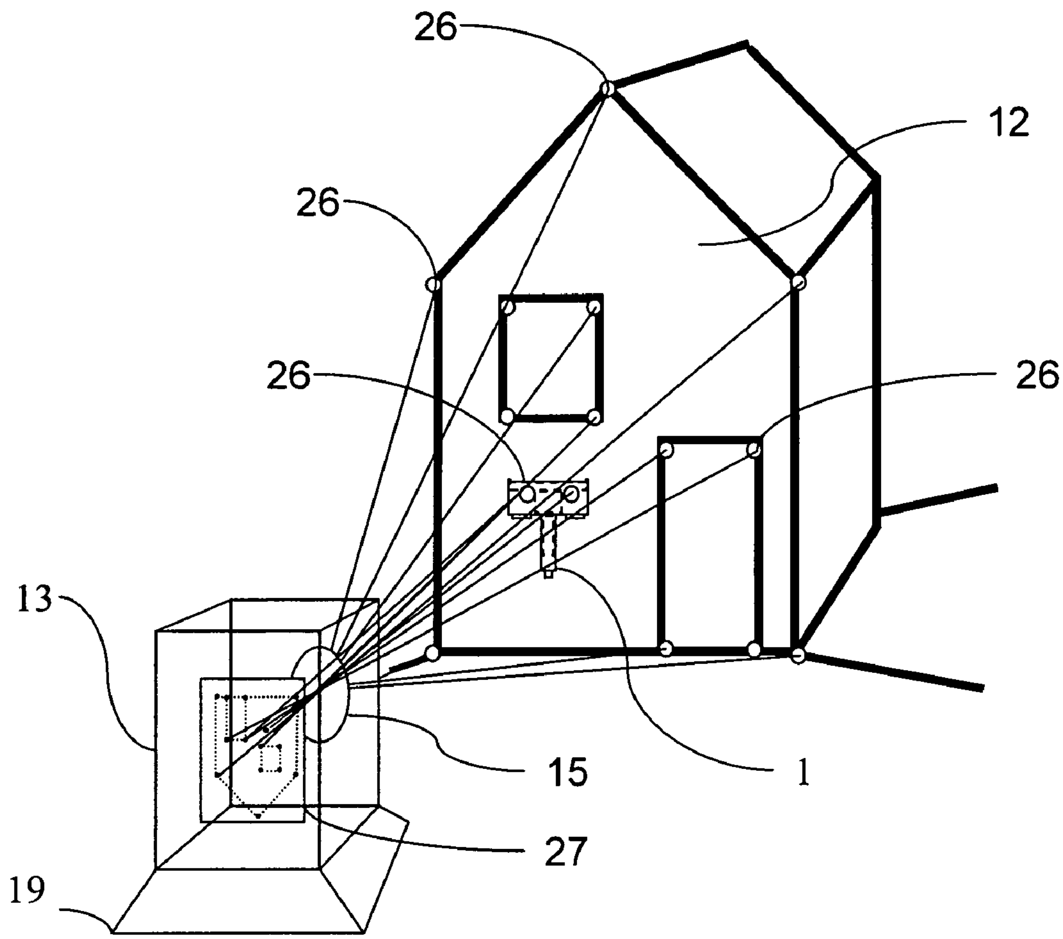

FIG. 6: Second embodiment of the first measurement system

FIG. 7: Landmark

Figure 8:
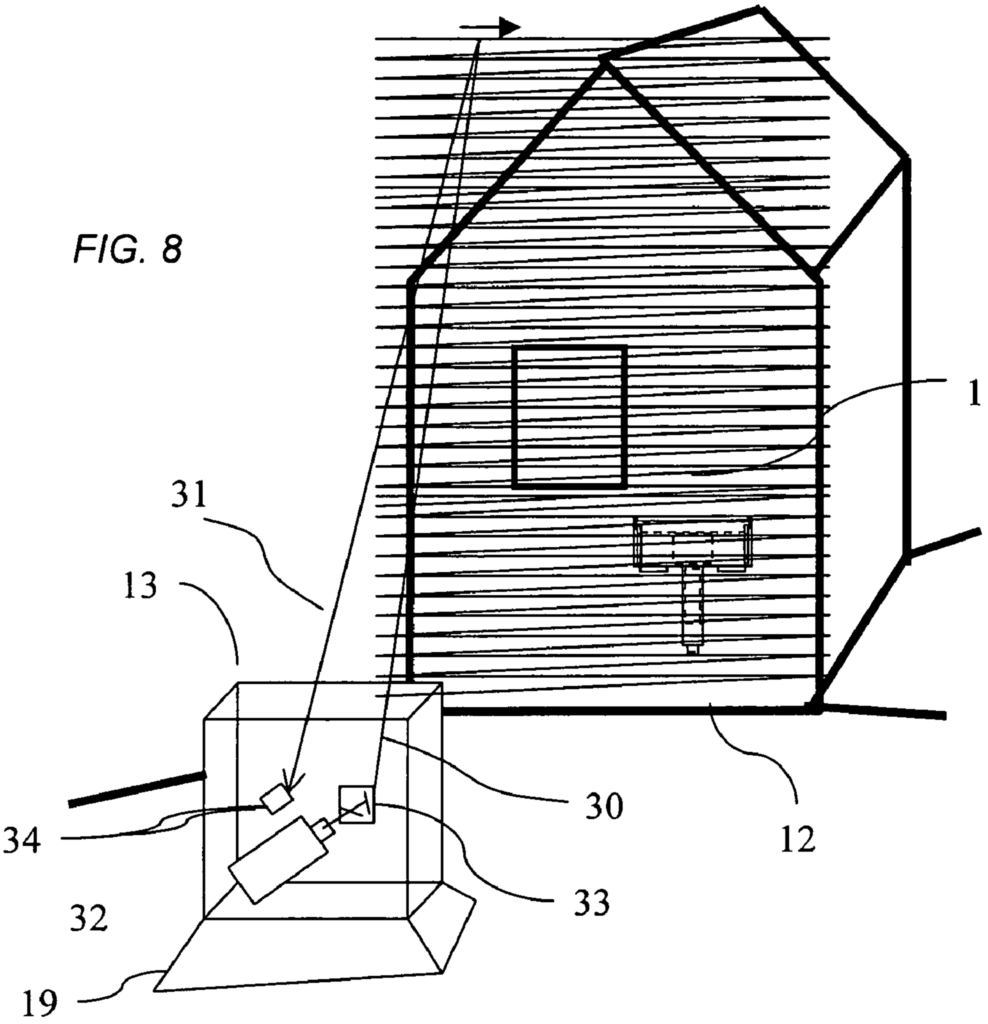

FIG. 8: Third embodiment of the first measurement system

Figure 9:
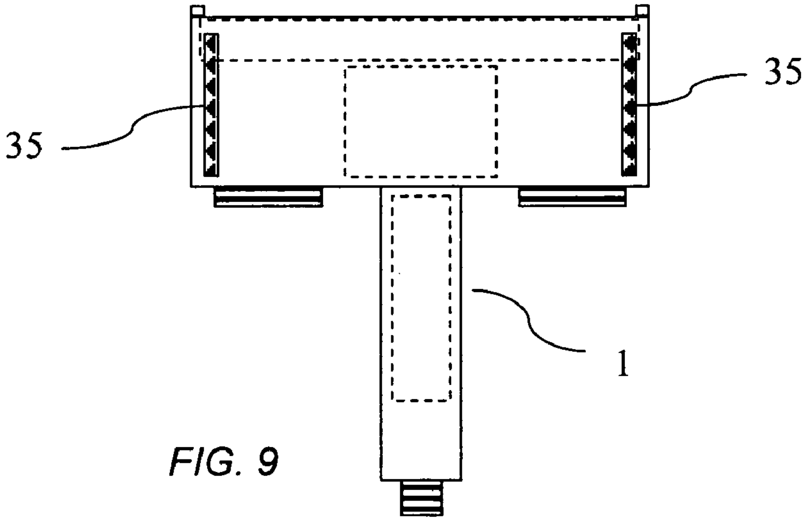

FIG. 9: Embodiment of a paint application system using a measurement system according to FIG. 8

Figure 10:
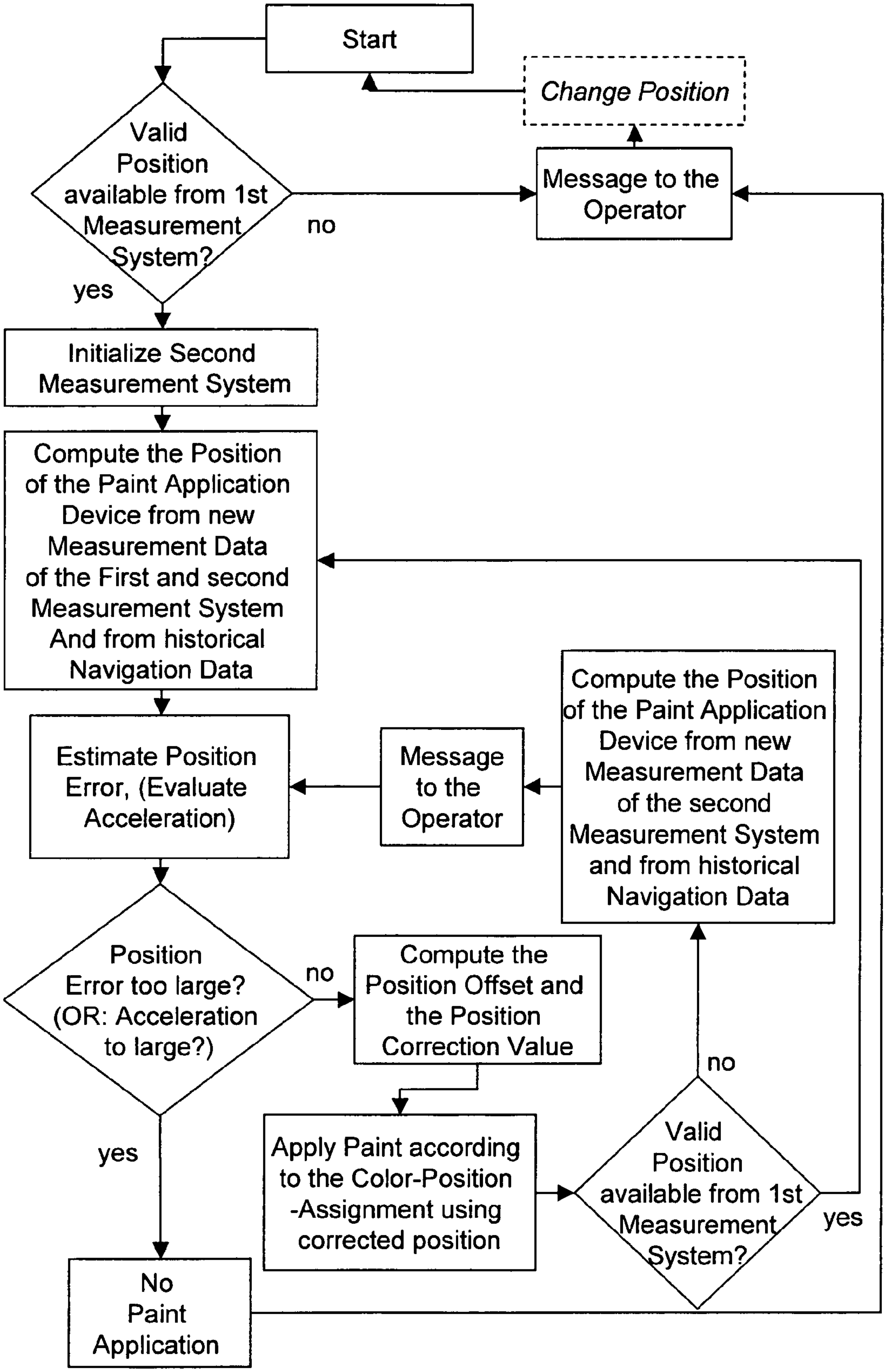

FIG. 10: Control strategy

Figure 11:
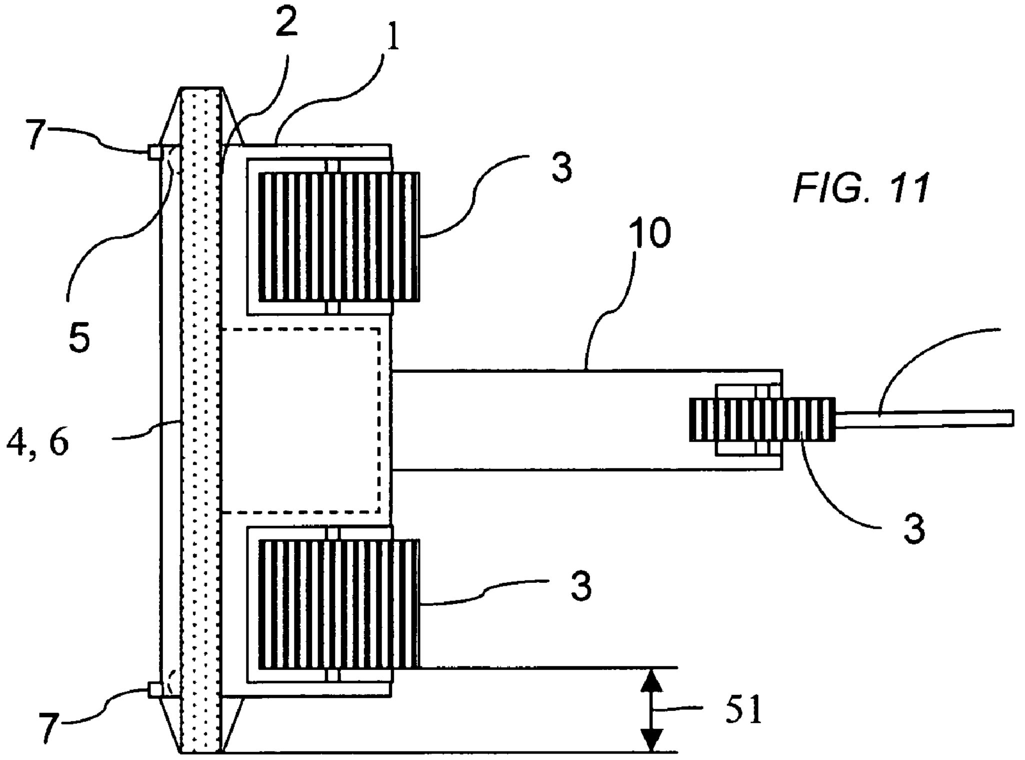
Figure 12:
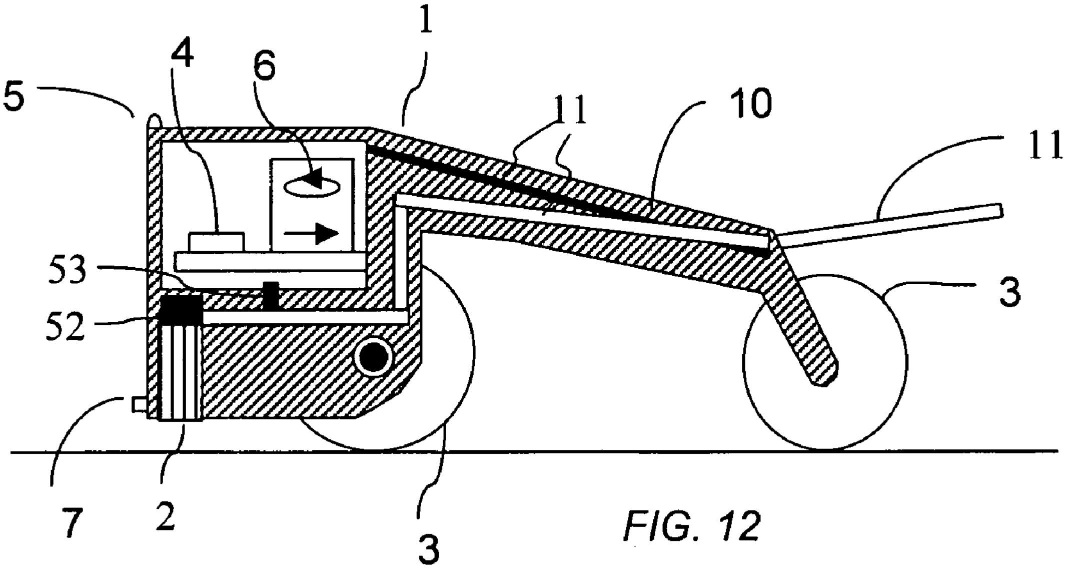

FIG. 11: and FIG. 12: First embodiment of the paint application device

Figure 13:
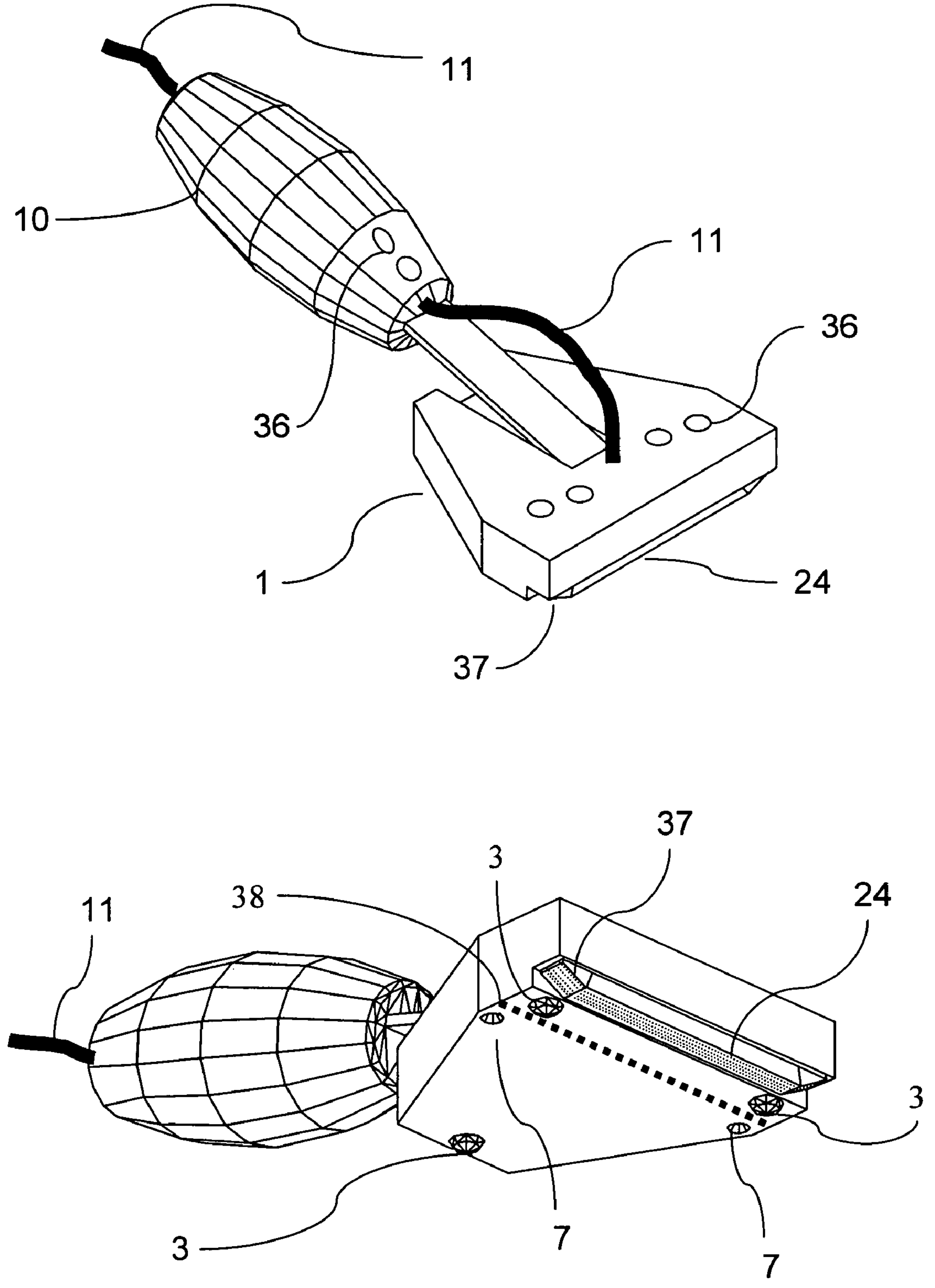

FIG. 13: Second embodiment of the paint application device

Figure 14:
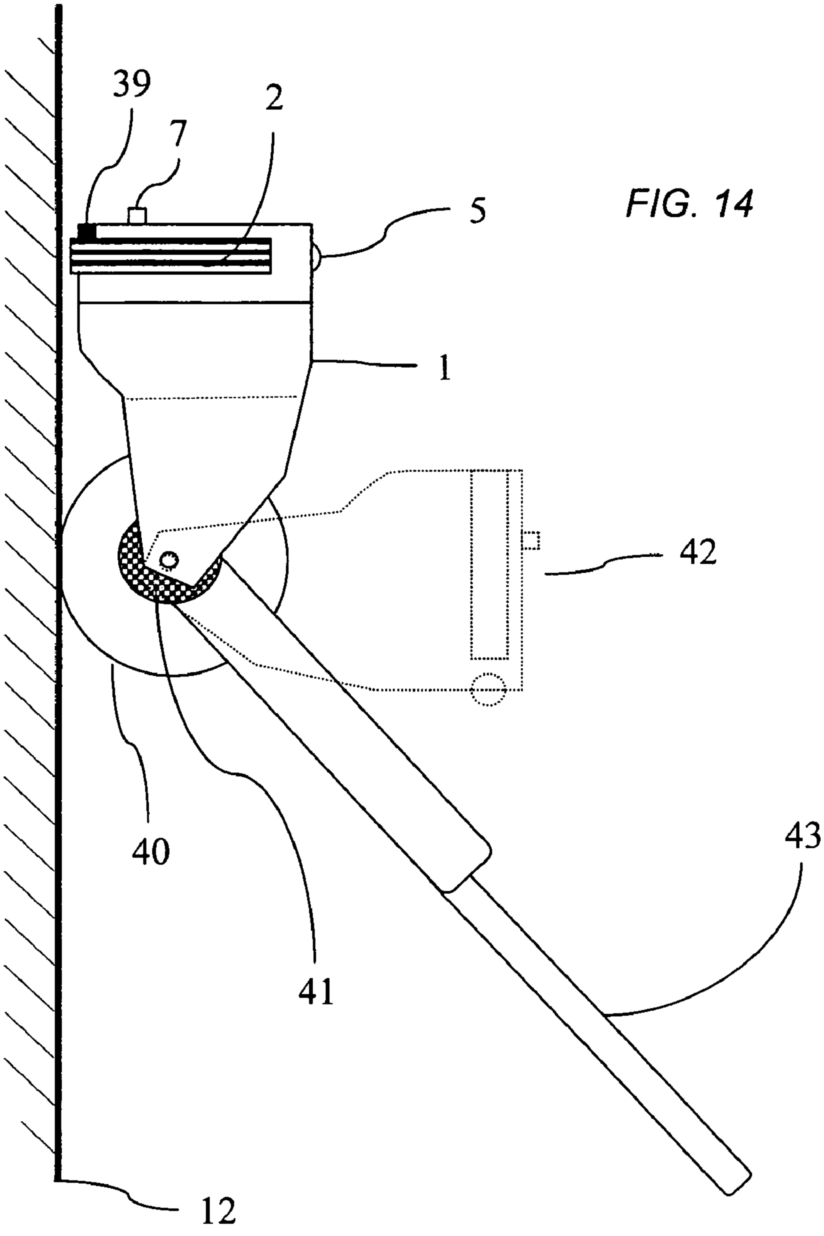

FIG. 14: Third embodiment of the paint application device

Figure 15:
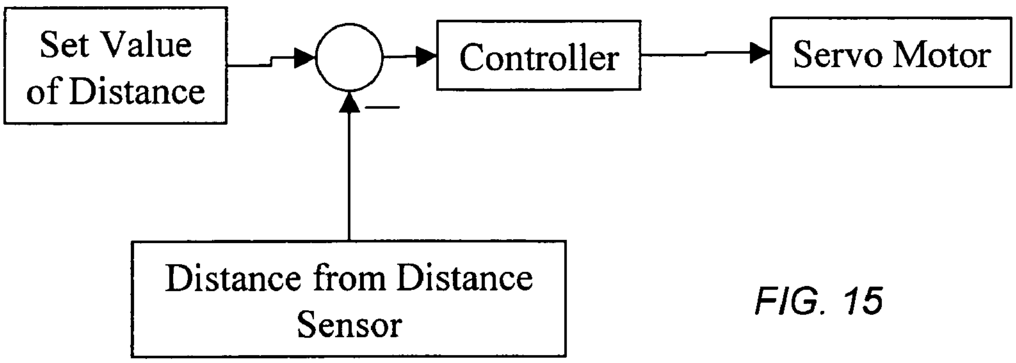

FIG. 15: Paint application nozzle distance control

Figure 16:
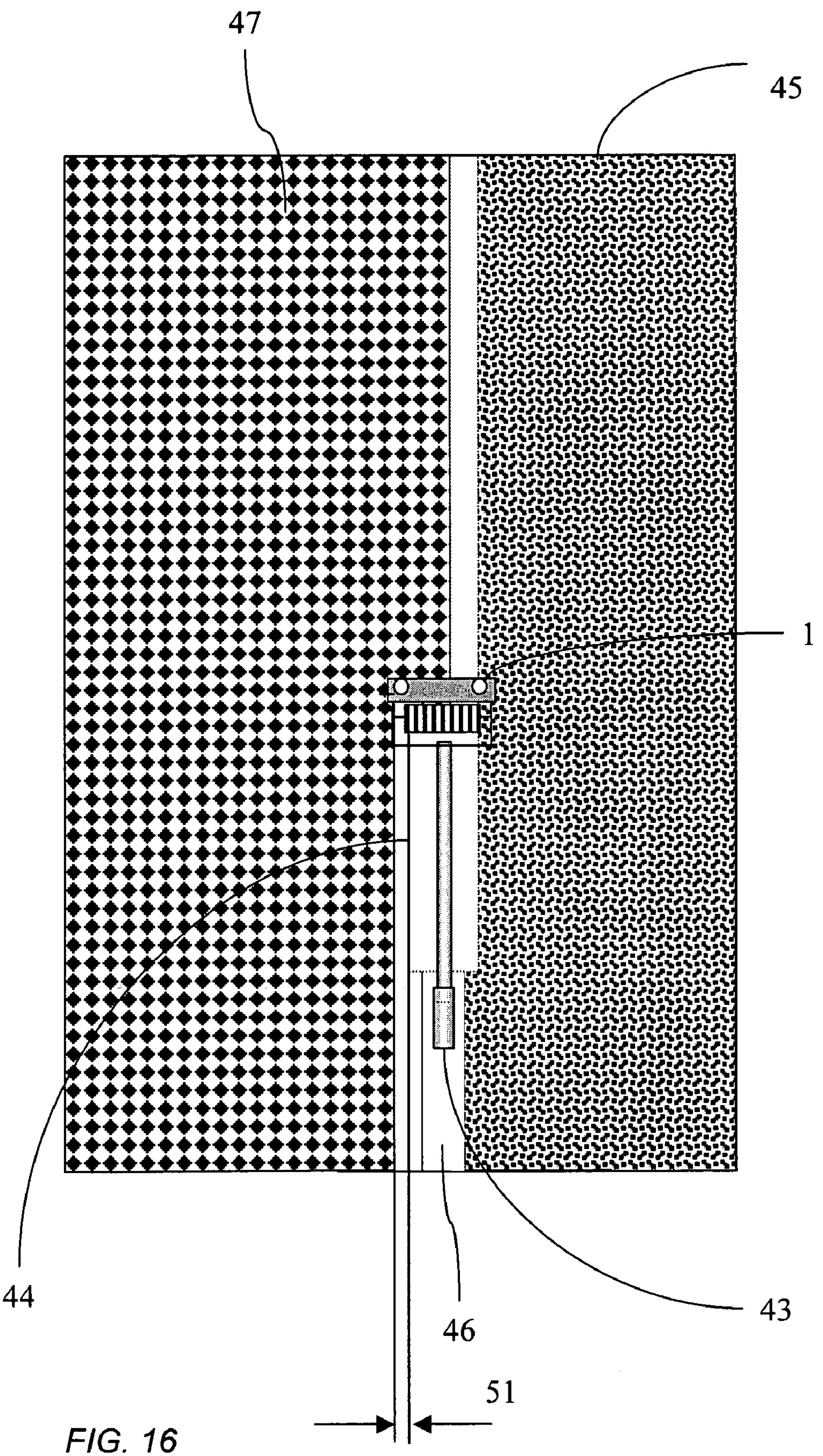

FIG. 16: Paint application using the paint application device according to FIG. 14

Figure 17:
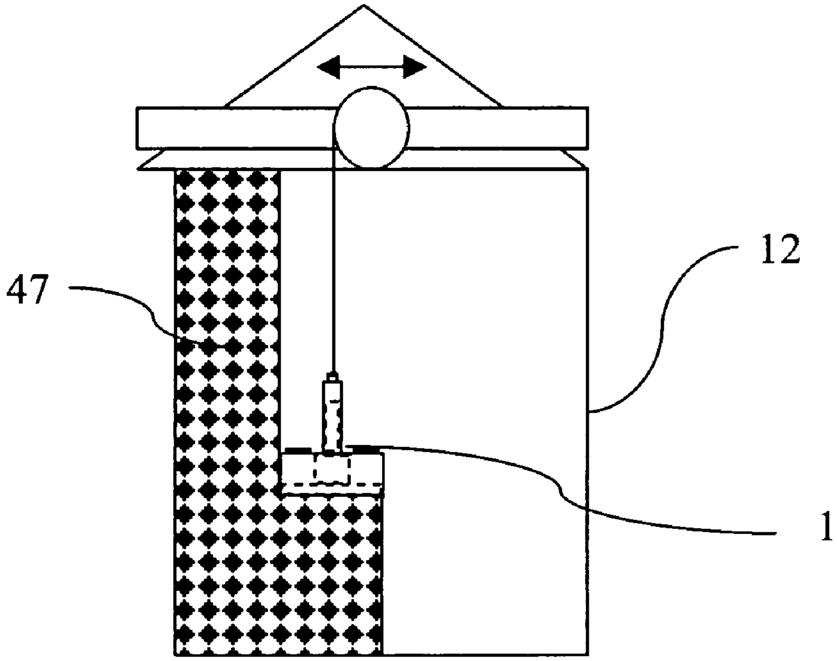

FIG. 17: Facade painting system using a cable feed

Figure 18:
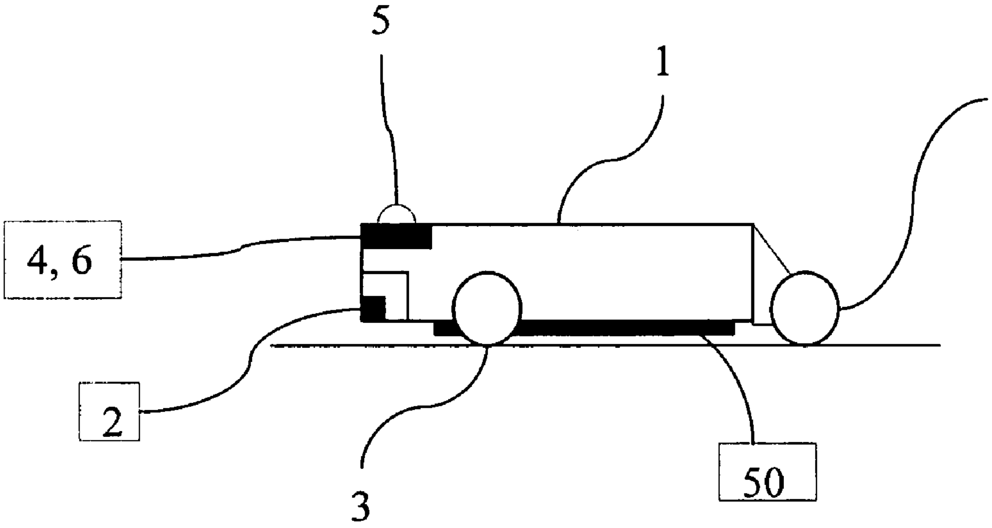

FIG. 18: Autarky robotic system

At the beginning of the work procedure the satellites as a subsystem of the first measurement system, see embodiments FIG. 2, FIG. 5, FIG. 6, FIG. 8, are mounted by the operator at fix positions. They define the reference coordinate system. For the functionality of the first measurement system it is necessary, that intervisbility is established between the paint application device and a minimal required number of satellites. This requirement may, normally, not be fulfilled at all points of the surface. But by mounting a large number of satellites the coverage of the object face can be optimized.

It is recommended to mount the satellites already when evaluating the geometry properties of the object face. By this the recording of the geometry and the paint application can be performed within the same coordinate system.

It is a common characteristic of the previously mentioned first measurement systems to utilize the linear propagation of waves of short wavelength, like light waves, IR-radiation, microwave radiation or ultrasound, for the position measurement. Positions may be computed from measured angles or elapsed time by techniques of prior art. Some of the known methods are called optical tracking in literature. For explanation some possibilities shall be described below:

FIG. 5 is a sketch of an embodiment of a measurement system containing a number of satellites at fixed positions. Using PSDs they measure their angular position relative to sources of modulated light located on the paint application device. The data is transmitted to a microprocessor, which calculates position information.

Figure 7:
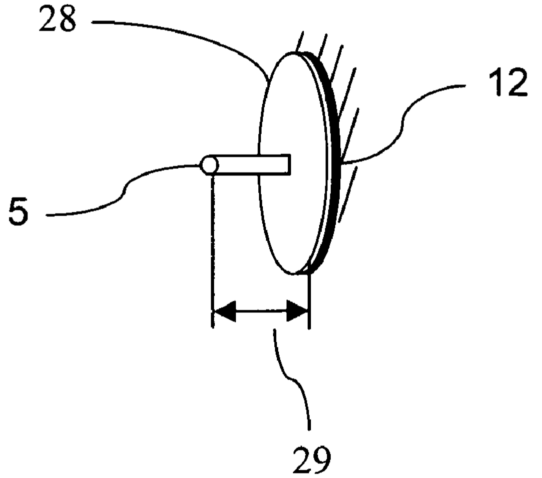

FIG. 6 depicts an embodiment of a photometric measurement system with one or more cameras and/or IR-cameras. The position of the paint application device is determined by numerical feature extraction and localistion techniques to known visual characteristics of the paint application device. This procedure can be much simplified, if the object face and/or the pairit application device contain light-emitting, reflecting or absorbing (for example colored) landmarks. FIG. 7 illustrates an embodiment of a landmark. A photometric system is furthermore well-suited to record color properties of the object face, which can be utilized for color adjustment for example.

In FIG. 8 a first measurement system is depicted comprising a scanning laser system. It contains a laser source 32, a beam deflection unit 33 and an integrated photoelectric transducer 34. The beam is scanned according to a prescribed temporal course over the object face 12 and the application device 1. The backscattered light 31 is recorded by the photoelectric transducer 34 and an image is reconstructed containing the object face and the paint application device. Also the aforementioned high-contrast landmarks may be involved here.

In a variant of the system as depicted in FIG. 8 additional light sensors are comprised within the paint application device, see FIG. 9. In the embodiment two rows of photoelectric transducers 35 detect the exact time of the laser beam when crossing the transducers thus allow to determine the position of the paint application device with respect to the known temporal course of the laser beam.

While above mentioned examples are well known as Outside-In Measurement Methods to experts, it may further be mentioned, that the first measurement system may also function according the known Inside-Out Measurement Methods by inverting the functional direction.

Furthermore the position measurement methods based on propagation delay, on the doppler effect and on interference measurements shall not be excluded from being well-suited for use in the first position measurement system.

The second measurement system is used for the transition navigation in cases, when the first measurement system either is unable to supply position data in sufficient rate due to a measurement frequency, which is low by principle, or due to an interrupted intervisibility between the paint application device and a critical number of satellites. Sensors out of the prior art may be employed to measure one or more linear and/or rotational velocities and/or one or more linear and/or rotational accelerations.

Normally these systems can not carry out an absolute position sensing.

Supplementary information for the calculation of a position can be gained with the aid of inclinometers and/or magnetometers.

A further possibility to provide position information is to record the object face by a photoelectric transducer, like a scanner or camera, followed by processing a feature extraction. Appropriate features may be the already recorded part of the image, if it is rich in contrast, a reference pattern or constructive features, for example edges. A quality improvement can be achieved by determining the color value of the surface before and after paint application, and based on that information calculate the color amount continuously by a control algorithm.

FIG. 11 and FIG. 12 show a first embodiment of a paint application device from different views. An inertial measurement system 6 and velocity sensors 7 provide motion information in addition to the first measurement system, as represented by a landmark 5. The inertial system comprises for example an angular rate sensor to measure the rotational velocity of the paint application device around an axis perpendicular to the object face and an linear acceleration sensor measuring the acceleration in motion direction. A pressure sensor 53 allows to control the paint supply pressure. The array of paint application elements is designed to laterally protrude the rollers 3 laterally by a defined length, the overlap 51, see FIG. 11. The overlap is beneficial, when using slowly drying paint, because it allows painting without getting the wheels 3 into contact with previously applied, wet paint.

FIG. 13 shows a second embodiment of a paint application device 1 according to the method of the invention, which is especially suited to perform reparations or to add finishing touches. The device comprises sliding elements 3 to move it over the object face and a paint application head 24, comprising special paint nozzles 37, which are chamfered at the lateral edges. By this paint can also be applied in very concave edges and corners. An image scanning device 38 directed towards the object face enables to capture a partial image and thus to identify the own position with respect to the image. Different display and user interface elements allow to control the device.

When moving the paint application device over the object face beeing in contact with the same it has to be secured, that the distance and the angle between the paint application nozzles and the object face are well defined. This can, for example, be achieved by the use of wheels, rollers, also paint rollers or sliding elements.

FIG. 14 shows a third embodiment of a paint application device 1 comprising an automatic control of the distance between the paint application elements and the object face, and comprising a possibility to additionally apply a wet priming coat by an integrated paint roller 40. The device allows to perform paint application in a similar way of operation as using a paint roller. Coaxially within the hub of the roll there is a servo motor 41 for actuating the portion of the paint application device 1, which contains the paint nozzles 2, relative to the handhold with the integrated fluid supply 43. In the position 42 only a priming coat is applied, for example an emulsion paint, in the common way. After the application of the priming coat at a certain point of the object face, that part of the paint application device, which includes the paint nozzles 2, is rotated towards the object face by the servo motor, and a constant distance between the paint nozzles and the object face is maintained by using distance sensors 39, see the control diagram in FIG. 15. In the depicted embodiment the lateral dimensions of the paint application head exceed the roller 40 laterally.

FIG. 16 illustrates the procedure of color application using the device as depicted in FIG. 14. Priming coat and decorative layer may be applied subsequently or at the same time. To prevent smearing, the overlap 51 has to be permanently maintained.

FIG. 17 shows an embodiment of an autarc paint application device for facades. The paint application device is suspended at a cable, which is fed over a pulley, thus allowing vertical motions. Horizontal motions are applied be moving the pulley on a horizontal rail.

FIG. 18 shows as an embodiment an autarc, robotic paint application device with a low pressure suction mechanism 50. The mechanism, an autarc drive and steerability allow for a free motion also on vertical surfaces. The route of the device is roughly predetermined by the built-in controller 4. Based on the position measurement and the knowledge of the past route the paint application device calculates the future route automatically. Preferably three wheels 3, which are optionally steerable, are used to move the device on the surface.

FIG. 3 sketches a paint application head 24 of the paint application device, comprising three rows of paint spraying nozzles 20, 21, 22 for different primitive colors. Each paint is supplied through an inlet pipe from local or peripheral tanks. FIG. 4 shows a paint application head 24 comprising additional paint application elements 23 for applying a priming coat or conversion coating.

There are numerous technical possibilities to realize paint application arrays. Thereby the individual paint nozzles work according to the different techniques known from the prior art. As appropriate techniques for example the compressed air spraying, the low pressure spraying, the airless spraying, airmix spraying, supercritical spraying and hot spraying may be mentioned.

Just as well drop-on demand methods, which produce single droplets and catapult them onto the working surface, may be employed within a paint application device.

Fast drying paints or hot-melt paints are preferably used for paint application. If not applicable, paints are to be preferred, which cure fast when exposed to heat, to UV-radiation or to an air stream. In those cases the paint application device comprises means for paint curing, setting or fixing at its bottom side, for example a UV-lamp, an air fan or thermal radiator.

In a variant further layers are applied in parallel to the color layer within the same working operation, for example a ground coat or a conversion coating or a coating, that fixes the color layer chemically. Paint application elements of the paint application array may be utilized for this purpose or there may be additional paint application elements in front of or behind the paint nozzles, which respect to the moving direction. These may be designed identical or different as the paint application elements.

The ground coat may also be an emulsion paint, into which the color particles are embedded, either within the wet state of the emulsion paint or as a result of a solubility during color application.

List of Symbols

1 Paint application device
2 Array of color applying elements
3 Roller/sliding devices
4 Microcomputer
5 Light source, heat source
6 Inertial measurement system as part of the second measurement system
7 Optical velocity sensor as part of the second measurement system
8 Paint reservoir
9 Battery
10 Handhold
11 Fluid supply
12 Surface of the object
13 Satellite of the first measurement system
14 Position sensing device (PSD) or camera
15 Optical lens
16 Obstacle, disturbance
17 Beam of modulated light 1
18 Beam of modulated light 2
19 Fixation
20 Paint nozzle for a first basic color
21 Paint nozzle for a second basic color
22 Paint nozzle for a third basic color
23 Paint application elements for applying a ground layer or finishing layer
24 Paint application head
25 UV-light source for layer curing
26 Landmark
27 Camera chip, projected image
28 Substrate, transparent
29 Reference distance
30 Emitted laser beam
31 Scattered beam
32 Laser source
33 Beam deflection unit
34 photoelectric transducer
35 Retroreflecting Landmark or photoelectric transducer array
36 Display, user interface
37 Paint application head, tilted
38 Image scanner
39 Distance sensor
40 Paint roll
41 Coaxial servo motor
42 Position for applying base coat
43 Handle including media supply
44 Fresh base coat
45 Original surface
46 Base coat
47 Decorative paint coat
48 Horizontal rail
49 Vehicle comprising a pulley, an integrated drive, and a system control
50 Low pressure suction mechanism
51 Overlap
52 Valve block
53 Pressure sensor

I claim:

1. A method for applying a color design to a surface of a wall around protrusions, balconies, doors, windows, sills, or cornices using a movable application device comprising a first position measurement system configured to measure a position of the movable application device relative to multiple stationary components, a computer control unit, multiple paint application elements, a second position measurement system configured to measure a motion of the movable application device, and at least one roller or sliding element, wherein the method comprises, moving the movable application device on the surface;

measuring the position of the movable application device during the step of moving;

and controlling the paint application elements based upon the step of measuring;

which includes a first step of positioning multiple stationary components at fixed locations to define a reference coordinate system for the first position measurement system;

measuring geometric properties of the surface within the reference coordinate system to generate a first data set, which is a digital representation of the geometry of the surface;

generating a second dataset by assigning color data of the color design to the first data set;

a second, paint applying step of applying paint to a portion of the surface alongside an area containing previously applied paint by moving the movable application device in a way, that the rollers or sliding elements do not contact the previously applied paint by configuring the movable application device to have the paint application elements protrude laterally beyond the rollers or sliding elements;

applying paint at a first position on the surface where valid position data is available by using the first measurement system;

applying paint at a second position on the surface by using the second measurement system wherein the first measurement system is unable to provide valid position data due to disturbed intervisibility between the movable application device and a minimum required number of stationary components by performing the steps of, relocating the paint application device to a third position on the surface, where valid position data is available from the first measurement system;

and subsequently moving the application device from the third position to the second position on the surface, where the position data of the second position is calculated by the computer control unit based on the third position from the first measurement system, and movement data from second measurement system.

* * * * *